(12) United States Patent
Wang et al.

(10) Patent No.: US 11,839,104 B2
(45) Date of Patent: *Dec. 5, 2023

(54) FLEXIBLE DISPLAY SUBSTRATE AND METHOD OF MANUFACTURING THE SAME, DISPLAY PANEL AND DISPLAY APPARATUS

(71) Applicant: BOE TECHNOLOGY GROUP CO., LTD., Beijing (CN)

(72) Inventors: Tao Wang, Beijing (CN); Peng Cai, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

This patent is subject to a terminal disclaimer.

(21) Appl. No.: 17/731,807

(22) Filed: Apr. 28, 2022

(65) Prior Publication Data

US 2022/0255039 A1    Aug. 11, 2022

Related U.S. Application Data

(63) Continuation of application No. 16/081,300, filed as application No. PCT/CN2018/072120 on Jan. 10, 2018, now Pat. No. 11,349,096.

(30) Foreign Application Priority Data

Jun. 6, 2017 (CN) .......................... 201710422343.0

(51) Int. Cl.
*H10K 50/844* (2023.01)
*H10K 71/00* (2023.01)
(Continued)

(52) U.S. Cl.
CPC .......... *H10K 50/844* (2023.02); *H10K 71/00* (2023.02); *H10K 77/111* (2023.02); *H10K 2102/311* (2023.02)

(58) Field of Classification Search
None
See application file for complete search history.

(56) References Cited

U.S. PATENT DOCUMENTS 6,100,112 A      8/2000  Amano et al.
11,349,096 B2 *  5/2022  Wang ..................... H10K 71/00
(Continued)

FOREIGN PATENT DOCUMENTS

CN    103715366 A    4/2014
CN    104124258 A    10/2014
(Continued)

OTHER PUBLICATIONS

Chinese First Office Action dated May 21, 2018 relating to CN Patent Application No. 201710422343.0.
(Continued)

*Primary Examiner* — Hung K Vu
(74) *Attorney, Agent, or Firm* — DINSMORE & SHOHL LLP (57) ABSTRACT

The present disclosure relates to a flexible display substrate and a method of manufacturing the same, a display panel and a display apparatus. The flexible display substrate has a display region and a non-display region. In some embodiments, the flexible display substrate comprises: a base substrate and an inorganic film layer provided on the base substrate, wherein the inorganic film layer of the non-display region is provided with a groove; and a filling structure for filling the groove.

17 Claims, 3 Drawing Sheets

(51) Int. Cl.
   *H10K 77/10*   (2023.01)
   *H10K 102/00*  (2023.01)

(56) References Cited

U.S. PATENT DOCUMENTS

| | | |
|---|---|---|
| 2007/0173031 A1 | 7/2007 | Kodaira et al. |
| 2016/0035997 A1 | 2/2016 | Oh |
| 2017/0062760 A1 | 3/2017 | Kim |
| 2017/0110526 A1* | 4/2017 | Eo .................... H10K 59/1213 |

FOREIGN PATENT DOCUMENTS

| | | |
|---|---|---|
| CN | 105612271 A | 5/2016 |
| CN | 106653818 A | 5/2017 |
| CN | 106684262 A | 5/2017 |
| CN | 107195794 A | 9/2017 |

OTHER PUBLICATIONS

Chinese Second Office Action dated Jan. 30, 2019 relating to CN Patent Application No. 201710422343.0.
International Search Report & Written Opinion relating to PCT/CN2018/072120 filed Jan. 10, 2018, dated Apr. 10, 2018.
Final Office Action dated Aug. 20, 2021 relating to U.S. Appl. No. 16/081,300, filed Aug. 30, 2018.
Non-Final Office Action dated Mar. 4, 2021 relating to U.S. Appl. No. 16/081,300, filed Aug. 30, 2018.
Non-Final Office Action dated Nov. 12, 2021 relating to U.S. Appl. No. 16/081,300, filed Aug. 30, 2018.
Notice of Allowance dated Jan. 28, 2022 relating to U.S. Appl. No. 16/081,300, filed Aug. 30, 2018.

* cited by examiner

FLEXIBLE DISPLAY SUBSTRATE AND METHOD OF MANUFACTURING THE SAME, DISPLAY PANEL AND DISPLAY APPARATUS

CROSS-REFERENCE TO RELATED APPLICATIONS

The present application is continuation application of U.S. patent application Ser. No. 16/081,300 filed on Aug. 30, 2018, which is a U.S. National Stage Application under 35 U.S.C. § 371 of International Patent Application No. PCT/CN2018/072120, filed on Jan. 10, 2018, which claims the priority rights of the Chinese Patent Application No. 201710422343.0, filed on Jun. 6, 2017, the disclosure of which is hereby incorporated by reference in its entirety for all purposes.

TECHNICAL FIELD

The present disclosure relates to a flexible display substrate and a method of manufacturing the same, a display panel and a display apparatus.

BACKGROUND

During the manufacture of an Organic Light-Emitting Diode (briefly referred to as OLED), an inorganic film layer is generally provided on a substrate in order to realize flatness of the substrate. However, the inorganic film layer has a low elasticity and a large internal stress, and cracks are easily formed therein under the action of an internal force or an external force.

SUMMARY

The present disclosure provides a flexible display substrate having a display region and a non-display region. The flexible display substrate comprises a base substrate and an inorganic film layer provided on the base substrate, wherein the inorganic film layer of the non-display region is provided with a groove; and a filling structure for filling the groove.

In some embodiments, the groove comprises a plurality of grooves, and a space exist between the plurality of grooves.

In some embodiments, the space between the grooves is 3 to 20 µm.

In some embodiments, the groove is a rectangle or a trapezoid.

In some embodiments, the groove is the rectangle, and the groove has a width of 3 to 20 µm.

In some embodiments, the groove is the trapezoid, and the groove has a long side of 5 to 20 µm and a short side of 3 to 10 µm.

In some embodiments, the groove is provided in a region within 300 µm from an edge of the base substrate.

In some embodiments, the filling structure comprises a filler and a bump. The filler is provided within the groove, and the bump is provided above the groove. The filler and the bump are integrally formed.

In some embodiments, a distance between an edge of the bump and an edge of the groove closest to the edge of the bump is 20 to 100 µm, and the bump has a height of less than or equal to 30 µm.

In some embodiments, a depth of the groove is equal to a thickness of the inorganic film layer.

In some embodiments, the groove has a depth of 0.5 to 10 µm.

In some embodiments, the filling structure has a material of an organic material.

In some embodiments, the inorganic film layer comprises a plurality of inorganic film layers.

In addition, the present disclosure further provides a display panel comprising the flexible display substrate.

In addition, the present disclosure further provides a display apparatus comprising the display panel.

In addition, the present disclosure further provides a method of manufacturing the flexible display substrate, the flexible display substrate having a display region and a non-display region, the method comprising: providing a base substrate; forming an inorganic film layer on the base substrate; providing a groove in the inorganic film layer of the non-display region; and filling the groove to form a filling structure.

In some embodiments, after forming the filling structure, the method further comprises attaching a protective film onto the inorganic film layer of the non-display region; and removing the protective film after the use of the protective film is completed.

BRIEF DESCRIPTION OF THE DRAWINGS

The drawings are used to provide a further understanding of the technical solutions of the present disclosure, and constitute a part of the specification, which, together with the embodiments of the present application, are used to explain the technical solutions of the present disclosure, and do not constitute a limitation of the technical solutions of the present disclosure.

DETAILED DESCRIPTION

To make objectives, technical solutions and advantages of the present disclosure clearer, the embodiments of the present disclosure will be described in detail below with reference to the accompanying drawings. It should be noted that, in the case of no conflict, the features in the embodiments and the embodiments in the present application may be arbitrarily combined with each other.

The steps illustrated in the flow chart of the figures may be executed in a computer system such as a set of computer executable instructions. Also, although logical sequences are shown in the flow chart, the steps as shown or described may be performed in a different order than the ones described herein in some cases.

In a conventional process of manufacturing the OLED, after a thin film package of the OLED structure is completed, it is necessary to cut the OLED into individual display component units. During the cutting or handling, cracks will be formed in the inorganic film layer under the action of an external force and the formed cracks are further caused to diffuse to the inside of the OLED, thereby to affect a quality of the OLED. To solve this technical problem, conventional techniques will generally provide a bump or a groove in the inorganic film layer of the non-display region to prevent the quality of the OLED from being affected by the cracks formed in the inorganic film layer.

In the process of manufacturing the OLED, after the display components units are formed, it is further necessary to attach functional film layers to the OLED. Prior to the attachment, it is necessary to attach a protective film to a surface of the display component, and the protective film is in direct contact with the OLED. Since various material layers of the OLED are bonded to each other only by the Van der Waals force, the bonding force is very weak and thus badness is easily formed when the protective film is removed. The protective film is required to necessarily have a low viscosity, so as to reduce a risk of delamination of the OLED material which is caused when the protective film is removed. However, providing the bump or the groove in the non-display region will cause, during the attachment of the protective film, a surface area of attachment to be increased and the bonding strength to be greater than an expected value, which causes an increase in the force to be applied when the protective film is removed, and increases a risk of delamination which is caused when the protective film is removed.

Embodiments of the present disclosure provide a flexible display substrate and a method of manufacturing the same, a display panel and a display apparatus. The flexible display substrate has a display region and a non-display region. In some embodiments, the flexible display substrate comprises: a base substrate and an inorganic film layer provided on the base substrate, wherein the inorganic film layer of the non-display region is provided with a groove; and a filling structure for filling the groove. By providing the groove in the inorganic film layer of the non-display region, one aspect of the present disclosure guarantees the flexible display substrate to have a function of preventing the cracks and reduces an effect of the cracks of the inorganic film layer on the OLED. By filling the groove with the filling structure, another aspect of the present disclosure causes a surface of the region corresponding to the groove to become flat so as to reduce a contact area between the surface and the protective film, reduce a surface area of attachment, reduce a bonding strength of the protective film, reduce or even eliminate the risk of delamination which is caused when the protective film is removed.

Figure 1:
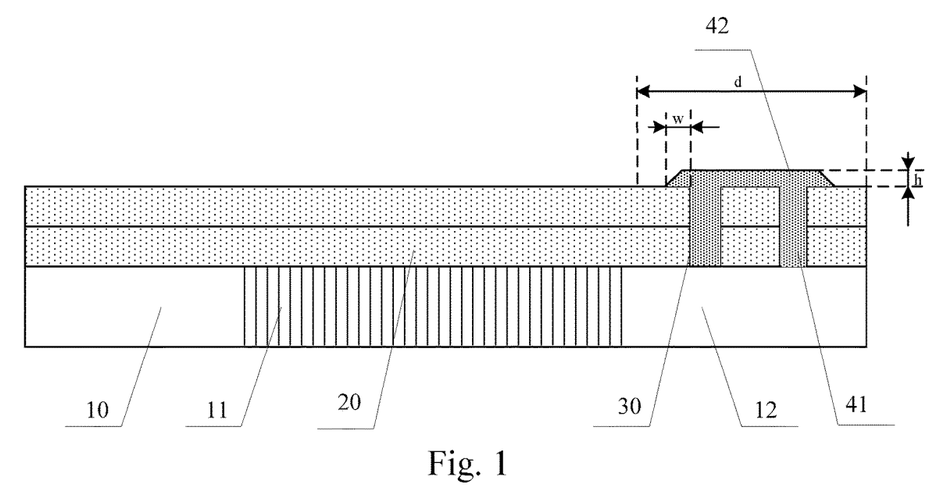
FIG. 1 is a structural schematic diagram of the flexible display substrate as provided by the embodiment of the present disclosure.

FIG. 1 is a structural schematic diagram of the flexible display substrate as provided by the embodiment of the present disclosure. As shown in FIG. 1, the flexible display substrate as provided by the embodiment of the present disclosure has a display region 11 and a non-display region 12. In some embodiments, the flexible display substrate comprises: a base substrate 10 and an inorganic film layer 20 provided on the base substrate 10, wherein the inorganic film layer 20 of the non-display region 12 is provided with a groove 30. The flexible display substrate further comprises a filling structure for filling the groove 30.

In some embodiments, the base substrate 10 may be a glass substrate or a plastic substrate, to which no limit is made by the embodiment of the present disclosure. In some embodiments, prior to the formation of the inorganic film layer 20, a pre-washing operation may be performed to the base substrate. It should be noted that, the display region 11 is used for providing a light-emitting structure thereon to display an image, and the non-display region 12 is used for providing a peripheral circuit of the display region 11.

In some embodiments, the inorganic film layer 20 comprises a plurality of inorganic film layers. FIG. 1 takes two layers as an example for explanations. The present disclosure is not limited thereto.

In some embodiments, the inorganic film layer has a material of an inorganic nanomaterial. The inorganic nanomaterial is dispersed within an ethylene unsaturated monomer. In some embodiments, the dispersion of the inorganic nanomaterial within the ethylene unsaturated monomer may certainly cause the inorganic nanomaterial to be uniformly dispersed into the ethylene unsaturated monomer. The dispersion of the inorganic nanomaterial within the ethylene unsaturated monomer is for the purpose of causing the inorganic nanomaterial and the ethylene unsaturated monomer to realize a mutual dissolution of organic and inorganic materials. By curing the inorganic nanomaterial along with the ethylene unsaturated monomer via ultraviolet light, an excellent bond of the inorganic material and the organic material may be obtained.

In addition, an inorganic film layer may be added with a photo initiator and/or wetting leveling agent. The wetting leveling agent may be introduced to adjust a surface tension of a liquid mixture, so as to make flatness of the film layer better when it is formed.

In some embodiments, the inorganic nanomaterial comprises a combination of one or more of AlO, ZnO, TiO, $SiO_2$ and ZrO. That is, a material of the inorganic film layer 20 may be selected from one or several of AlO, ZnO, TiO, $SiO_2$ and ZrO.

In the embodiment of the present disclosure, a cross section of the groove 30 in a direction perpendicular to a surface of the base substrate 10 is a rectangle. A depth of the groove 30 is equal to a thickness of the organic film layer 20. In some embodiments, the groove 30 has the depth of 0.5 to 10 μm and a width of 3 to 20 μm. It should be noted that, if the base substrate comprises a substrate with a single layer, the depth of the groove should guarantee an etch through that organic film layer in contact with the base substrate. If the base substrate comprises a substrate with a plurality of layers, between which inorganic layers are provided to form an overlapped structure, then the depth of the groove should guarantee an etch through the inorganic film layer in contact with the top of the uppermost layer of the substrate.

In some embodiments, the groove comprises a plurality of grooves, and spaces exist between the plurality of grooves. A space distance between the grooves is 3 to 20 The space distances between different grooves may be identical or different. The present disclosure is not limited thereto.

In some embodiments, the number of the grooves 30 is, e.g., 2 to 10. A different number of the grooves may be selected according to different requirements of design. It should be noted that, FIG. 1 takes two grooves as an example for explanations. The present disclosure is not limited thereto. A specific number is determined according to implementation situations. In addition, each of the grooves as comprised in the flexible display substrate has an identical depth and may have a different width.

In some embodiments, the groove 30 is provided in a region within 300 μm from an edge of the base substrate. A distance d is a distance from the edge of the base substrate, and d=300 μm in the present embodiment. As shown in FIG. 1, both grooves are provided in a region within d.

In the present embodiment, the filling structure has a material of an organic material, for example, an acrylic material. In the present embodiment, the organic material of the filling structure can be excellently bonded to the inorganic material of the inorganic film layer. In addition, the organic material and the inorganic material are different in terms of properties such as an elastic modulus or the like, and the occurrence of a mutational deformation of one material is not allowed at a contact interface of two materials. The formation of the cracks is further avoided.

In some embodiments, the filling structure comprises a filler 41 and a bump 42. The filler 41 is provided within the groove, and the bump 42 is provided above the groove. The filler 41 and the bump 42 are integrally formed.

In some embodiments, the bump 42 has a height h less than or equal to 30 μm. A distance w between an edge of the bump and an edge of the groove closest to the edge of the bump is 20 to 100 μm.

In the present embodiment, the bump covers all the grooves simultaneously, as well as a region outside the grooves. A shape of the bump may be an arbitrary shape. The present disclosure is not limited thereto. FIG. 1 takes a trapezoid as an example for explanations. In addition, the height of the bump is referred to a distance between a highest point and a bottom surface of the bump.

In the present embodiment, the filling structure fills the groove, which causes a surface of the region corresponding to the groove to become flat so as to reduce a contact area between the surface and the protective film, reduce a bonding force of the protective film, and reduce the risk of delamination which is caused when the protective film is removed. In addition, a low height of the filling structure outside the groove may further reduce a contact area between the surface of the region corresponding to the groove and the protective film.

The flexible display substrate as provided by the embodiment of the present disclosure has a display region and a non-display region. In some embodiments, the flexible display substrate comprises: a base substrate and an inorganic film layer provided on the base substrate, wherein the inorganic film layer of the non-display region is provided with a groove; and a filling structure for filling the groove. By providing the groove in the inorganic film layer of the non-display region, one aspect of the present disclosure guarantees the flexible display substrate to have a function of preventing the cracks and reduces an effect of the cracks of the inorganic film layer on the OLED. By filling the groove with the filling structure, another aspect of the present disclosure causes a surface of the region corresponding to the groove to become flat so as to reduce a contact area between the surface and the protective film, reduce a surface area of attachment, reduce a bonding strength of the protective film, reduce or even eliminate the risk of delamination which is caused when the protective film is removed.

Figure 2:
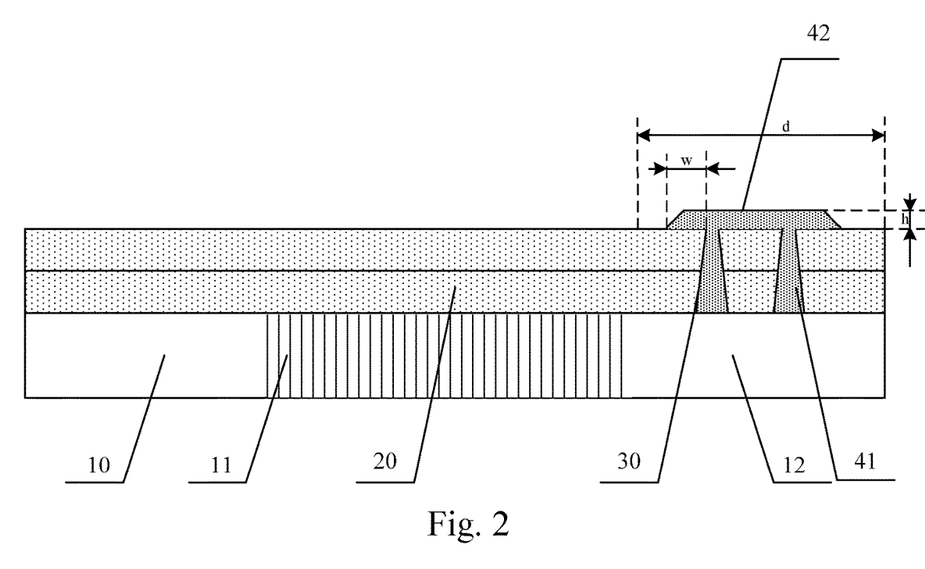
FIG. 2 is another structural schematic diagram of the flexible display substrate as provided by the embodiment of the present disclosure.

FIG. 2 is another structural schematic diagram of the flexible display substrate as provided by the embodiment of the present disclosure. As shown in FIG. 2, the flexible display substrate as provided by the embodiment of the present disclosure has a display region 11 and a non-display region 12. In some embodiments, the flexible display substrate comprises: a base substrate 10 and an inorganic film layer 20 provided on the base substrate 10, wherein the inorganic film layer 20 of the non-display region 12 is provided with a groove 30. The flexible display substrate further comprises a filling structure for filling the groove 30.

In some embodiments, the base substrate 10 may be a glass substrate or a plastic substrate, to which no limit is made by the embodiment of the present disclosure. In some embodiments, prior to the formation of the inorganic film layer, a pre-washing operation may be performed to the base substrate 10. It should be noted that, the display region 11 is used for providing a light-emitting structure thereon to display an image, and the non-display region 12 is used for providing a peripheral circuit of the display region 11.

In some embodiments, the inorganic film layer 20 comprises a plurality of inorganic film layers. FIG. 2 takes two layers as an example for explanations. The present disclosure is not limited thereto.

In some embodiments, the inorganic film layer has a material of an inorganic nanomaterial. The inorganic nanomaterial is dispersed within an ethylene unsaturated monomer. Specifically, the dispersion of the inorganic nanomaterial within the ethylene unsaturated monomer may certainly cause the inorganic nanomaterial to be uniformly dispersed into the ethylene unsaturated monomer. The dispersion of the inorganic nanomaterial within the ethylene unsaturated monomer is for the purpose of causing the inorganic nanomaterial and the ethylene unsaturated monomer to realize a mutual dissolution of organic and inorganic materials. By curing the inorganic nanomaterial along with the ethylene unsaturated monomer via ultraviolet light, an excellent bond of the inorganic material and the organic material may be obtained.

In addition, the inorganic film layer may be added with a photo initiator and/or wetting leveling agent. The wetting leveling agent may be introduced to adjust a surface tension of a liquid mixture, so as to make flatness of the film layer better when it is formed.

In some embodiments, the inorganic nanomaterial comprises a combination of one or more of AlO, ZnO, TiO, SiO2 and ZrO. That is, a material of the inorganic film layer 20 may be selected from one or several of AlO, ZnO, TiO, SiO2 and ZrO.

In the embodiment of the present disclosure, a cross section of the groove 30 is a trapezoid in a direction perpendicular to a surface of the base substrate 10. A depth of the groove 30 is equal to a thickness of the organic film layer 20. The groove 30 has a depth of 0.5 to 10 μm. The groove has a long side of 5 to 20 μm and a short side of 3 to 10 μm. It should be noted that, if the base substrate comprises a substrate with a single layer, the depth of the groove should guarantee an etch through that inorganic film layer in contact with the substrate. If the base substrate comprises a substrate with a plurality of layers, between which inorganic layers are provided to form an overlapped structure, then the depth of the groove should guarantee an etch through the inorganic film layer in contact with the top of the uppermost layer of the substrate.

In the embodiment of the present disclosure, the cross section of the groove in a direction perpendicular to a surface of the base substrate 10 is set as a trapezoid. In one aspect, the trapezoidal groove is filled with the aid of mobility of the organic material of the filling structure before being cured, and the cured organic material is embedded into the groove, which can enhance a bonding effect between the filling structure and the groove so as to prevent the filling structure from falling off during the handling. In another aspect, it is possible to further obstruct an inward extension of the cracks of the inorganic film layer.

In some embodiments, the groove comprises a plurality of grooves, and spaces exist between the plurality of grooves. A space distance between the grooves is 3 to 20 μm. The space distances between different grooves may be identical or different. The present disclosure is not limited thereto.

In some embodiments, the number of the grooves 30 is, e.g., 2 to 10. A different number of the grooves may be selected according to different requirements of design. It should be noted that, FIG. 2 takes two grooves as an example for explanations. The present disclosure is not limited thereto. A specific number is determined according to implementation situations. In addition, each of the grooves as comprised in the flexible display substrate has an identical depth and may have a different width.

In some embodiments, the groove 30 is provided in a region within 300 μm from an edge of the base substrate. A distance d is a distance from the edge of the base substrate, and d=300 μm in the present embodiment. As shown in FIG. 1, both grooves are provided in a region within d. The groove in the present embodiment is a trapezoid, and the groove 30 is provided in a region within 300 μm from the edge of the base substrate. Here, "within" is specifically referred to that a projection of the groove on the base substrate is in a region within 300 μm from the edge of the base substrate, that is, both the long side and the short side of the groove are in the region within 300 μm from the edge of the base substrate.

In the present embodiment, the filling structure has a material of an organic material, for example, an acrylic material. In the present embodiment, the organic material of the filling structure can be excellently bonded to the inorganic material of the inorganic film layer. In addition, the organic material and the inorganic material are different in terms of properties such as an elastic modulus or the like, and the occurrence of a mutational deformation of one material is not allowed at a contact interface of two materials. The formation of the cracks is further avoided.

In some embodiments, the filling structure comprises a filler 41 and a bump 42. The filler 41 is provided within the groove, and the bump 42 is provided above the groove. The filler 41 and the bump 42 are integrally formed.

In some embodiments, the bump 42 has a height h less than or equal to 30 μm. A distance w between an edge of the bump and an edge of the groove closest to the edge of the bump is 20 to 100 μm.

In the present embodiment, the bump covers all the grooves simultaneously, as well as a region outside the grooves. A shape of the bump may be an arbitrary shape. The present disclosure is not limited thereto. FIG. 1 takes a trapezoid as an example for explanations. In addition, a height of the bump is referred to a distance between a highest point and a bottom surface of the bump. In the present embodiment, the groove is a trapezoid, and thus the edge of the groove is referred to an edge of the short side of the groove.

In the present embodiment, the filling structure fills the groove, which causes a surface of the region corresponding to the groove to become flat so as to reduce a contact area between the surface and the protective film, reduce a bonding force of the protective film, and reduce a risk of delamination which is caused when the protective film is removed. In addition, a low height of the filling structure outside the groove may further reduce a contact area between the surface of the region corresponding to the groove and the protective film.

The flexible display substrate as provided by the embodiment of the present disclosure has a display region and a non-display region. In some embodiments, the flexible display substrate comprises: a base substrate and an inorganic film layer provided on the base substrate, wherein the inorganic film layer of the non-display region is provided with a groove; and a filling structure for filling the groove.

By providing the groove in the inorganic film layer of the non-display region, one aspect of the present disclosure guarantees the flexible display substrate to have a function of preventing the cracks and reduces an effect of the cracks of the inorganic film layer on the OLED. By filling the groove with the filling structure, another aspect of the present disclosure causes a surface of the region corresponding to the groove to become flat so as to reduce a contact area between the surface and the protective film, reduce a surface area of the attachment, reduce a bonding strength of the protective film, reduce or even eliminate a risk of delamination which is caused when the protective film is removed.

Figure 3:
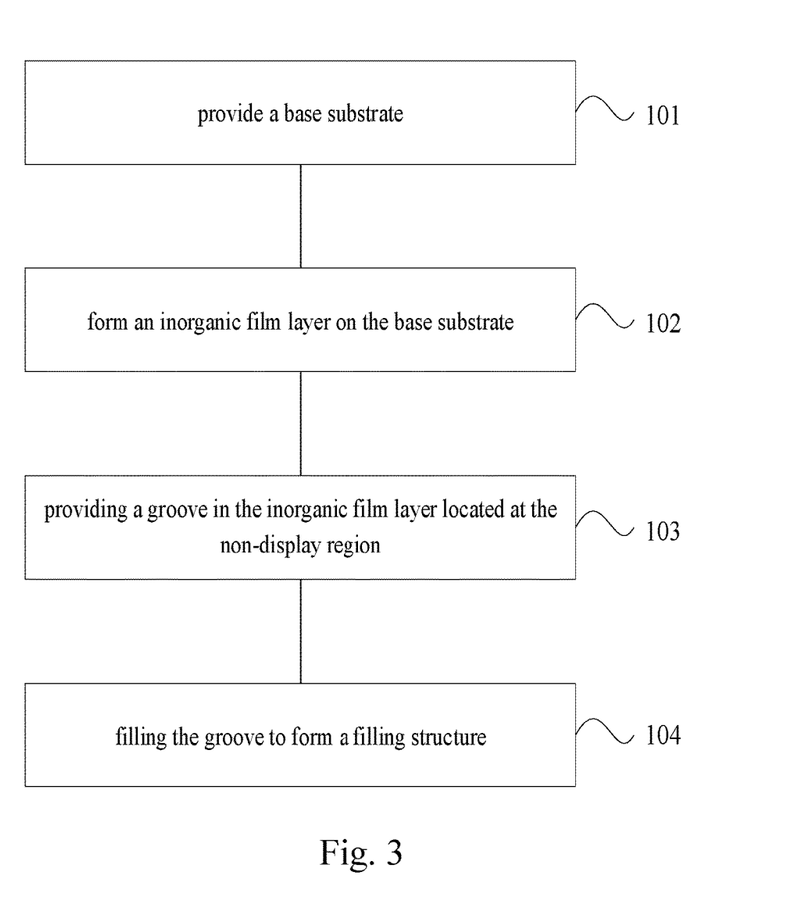
FIG. 3 is a flow chart of the method of manufacturing the flexible display substrate as provided by the embodiment of the present disclosure.

Based on the disclosed concept of the aforementioned embodiments, the embodiment of the present disclosure further provides a method of manufacturing the flexible display substrate. FIG. 3 is a flow chart of the method of manufacturing the flexible display substrate as provided by the embodiment of the present disclosure. As shown in FIG. 3, the method may comprise the following steps.

Step 101: providing a base substrate 10.

In particular, the flexible display substrate has a display region 11 and a non-display region 12.

The base substrate 10 may be a glass substrate or a plastic substrate, to which no limit is made by the embodiment of the present disclosure. In some embodiments, prior to the formation of the inorganic film layer, a pre-washing operation may be performed to the base substrate. It should be noted that, the display region 11 is used for providing a light-emitting structure thereon to display an image, and the non-display region 12 is used for providing a peripheral circuit of the display region 11.

Figure 4A:
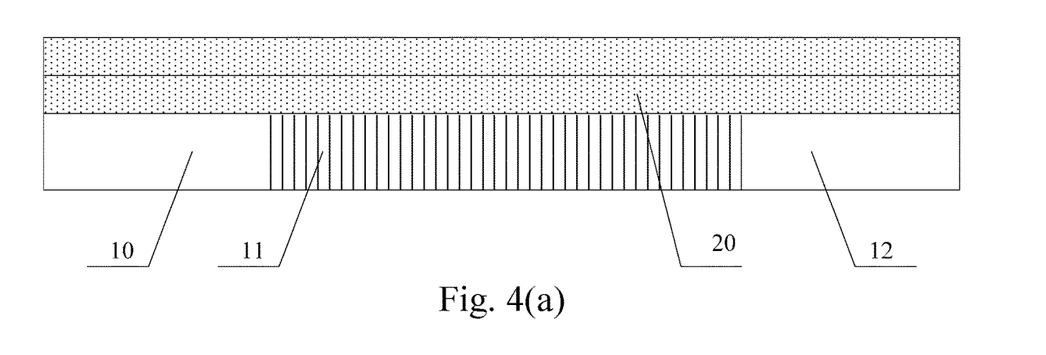
FIG. 4(a) is a structural schematic diagram of the method of manufacturing the flexible display substrate as provided by the embodiment of the present disclosure.

Step 102: forming an inorganic film layer 20 on the base substrate 10, e.g., as shown in FIG. 4(a).

In some embodiments, the inorganic film layer 20 comprises a plurality of inorganic film layers. The inorganic film layer has a material of an inorganic nanomaterial. The inorganic nanomaterial is dispersed within an ethylene unsaturated monomer. The dispersion of the inorganic nanomaterial within the ethylene unsaturated monomer may certainly cause the inorganic nanomaterial to be uniformly dispersed into the ethylene unsaturated monomer. The dispersion of the inorganic nanomaterial within the ethylene unsaturated monomer is for the purpose of causing the inorganic nanomaterial and the ethylene unsaturated monomer to realize a mutual dissolution of organic and inorganic materials. By curing the inorganic nanomaterial along with the ethylene unsaturated monomer via ultraviolet light, an excellent bond of the inorganic material and the organic material may be obtained.

In some embodiments, an inorganic film layer may be added with a photo initiator and/or wetting leveling agent. The wetting leveling agent may be introduced to adjust a surface tension of a liquid mixture, so as to make flatness of the film layer better when it is formed.

In some embodiments, the inorganic nanomaterial comprises a combination of one or more of AlO, ZnO, TiO, $SiO_2$ and ZrO. That is, a material of the inorganic film layer 20 may be selected from one or several of AlO, ZnO, TiO, $SiO_2$ and ZrO.

Figure 4B:
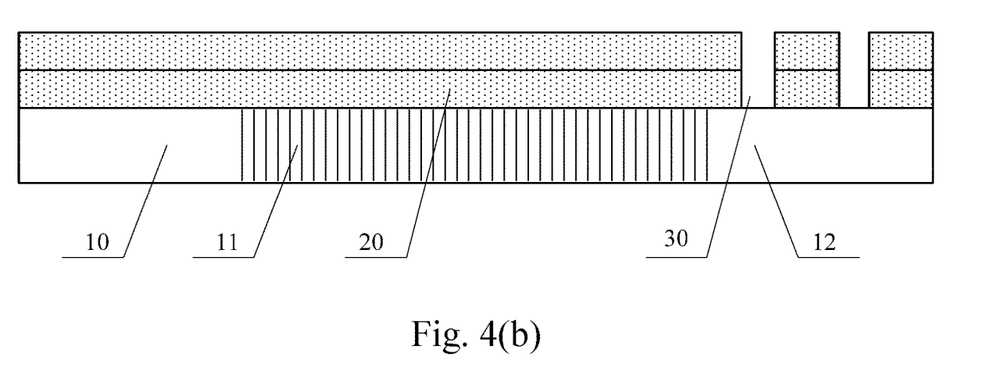
FIG. 4(b) is a structural schematic diagram of the method of manufacturing the flexible display substrate as provided by the embodiment of the present disclosure.

Step 103: providing a groove 30 in an inorganic film layer 20 of the non-display region, e.g., as shown in FIG. 4(b).

In some embodiments, the groove is formed by etching the inorganic film layer of the non-display region.

In the embodiment of the present disclosure, a cross section of the groove 30 in a direction perpendicular to a surface of the base substrate 10 has a shape of a rectangle or a trapezoid. If the groove has a shape of the rectangle, a depth of the groove 30 is equal to a thickness of the inorganic film layer 20. In some embodiments, the groove 30 has a depth of 0.5 to 10 μm and a width of 2 to 30 μm. If the groove has a shape of the trapezoid, a depth of the groove 30 is equal to a thickness of the inorganic film layer 20. In some embodiments, the groove 30 has a depth of 0.5 to 10 μm, and the groove has a long side of 5 to 10 μm and a short side of 3 to 10 μm. FIG. 4(*b*) takes a rectangular groove as an example for explanations. The present disclosure is not limited thereto. It should be noted that, if the base substrate comprises a substrate with a single layer, the depth of the groove should guarantee an etch through that inorganic film layer in contact with the substrate. If the base substrate comprises a substrate with the plurality of layers, between which inorganic layers are provided to form an overlapped structure, then the depth of the groove should guarantee an etch through the inorganic film layer in contact with the top of the uppermost layer of the substrate.

In some embodiments, the groove comprises a plurality of grooves, and spaces exist between the plurality of grooves. A space distance between the grooves is 3 to 20 μm. The space distances between the different grooves may be identical or different. The present disclosure is not limited thereto. In some embodiments, the groove 30 is provided in a region within 300 μm from an edge of the base substrate.

In some embodiments, the number of the grooves is, e.g., 2 to 10. A different number of the grooves may be selected according to different requirements of design. It should be noted that, FIG. 4(*b*) takes two grooves as an example for explanations. The present disclosure is not limited thereto. A specific number is determined according to implementation situations. In addition, each of the grooves as comprised in the flexible display substrate has an identical depth and may have a different width.

In the present embodiment, if a cross section of the groove in a direction perpendicular to a surface of the base substrate 10 has a shape of the trapezoid, in one aspect of the embodiment of the present disclosure, the trapezoidal groove is filled with the aid of mobility of the organic material of the filling structure before being cured, and the cured organic material is embedded into the groove, which can enhance a bonding effect between the filling structure and the groove so as to prevent the filling structure from falling off during the handling. In another aspect, it is possible to further obstruct an inward extension of the cracks of the inorganic film layer.

Figure 4C:
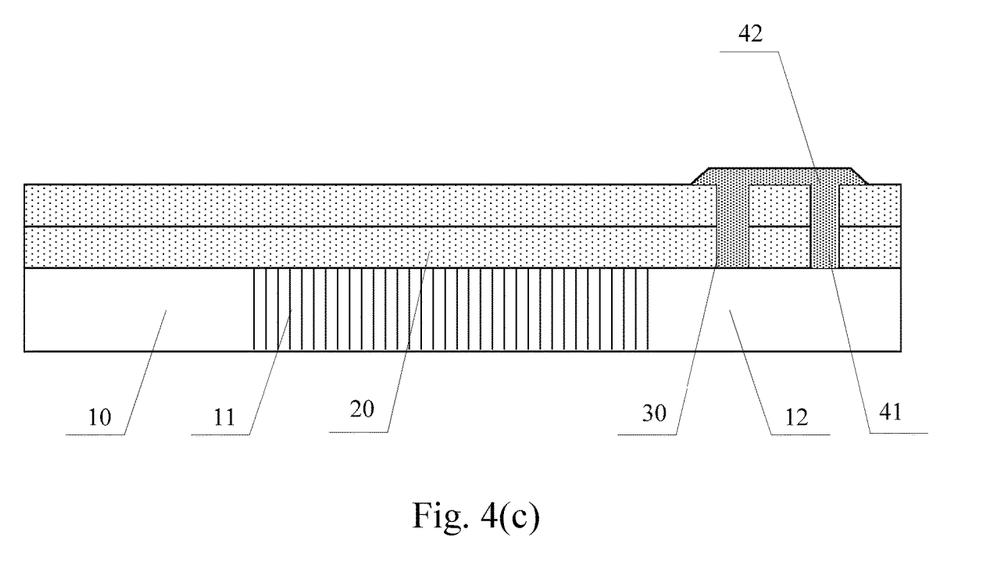
FIG. 4(c) is a structural schematic diagram of the method of manufacturing the flexible display substrate as provided by the embodiment of the present disclosure.

Step 104: filling the groove to form a filling structure, e.g., as shown in FIG. 4(*c*).

In the present embodiment, the filling structure has a material of an organic material, which may be an acrylic material. In the present embodiment, the material of the filling structure is different from that of the inorganic film layer, and the organic material and the inorganic material are different in terms of properties such as an elastic modulus or the like. The occurrence of a mutational deformation of one material is not allowed at a contact interface of two materials. The formation of the cracks is further avoided.

In some embodiments, the filling structure comprises a filler 41 and a bump 42. The filler 41 is provided within the groove, and the bump 42 is provided above the groove. The filler 41 and the bump 42 are integrally formed.

In some embodiments, a height h of the bump 42 is less than or equal to 30 μm. A distance between an edge of the bump and an edge of the groove closest to the edge of the bump is 20 to 100 μm.

In the present embodiment, the bump covers all the grooves simultaneously, as well as a region outside the grooves. A shape of the bump may be an arbitrary shape. The present disclosure is not limited thereto. FIG. 4(*c*) takes a trapezoid as an example for explanations.

In some embodiments, the organic material is filled into the groove by using the printing, the screen printing or the coating process, so as to form the filling structure and cause the groove to be filled up with the filling structure, or to be filled up with a Pixel Definition Layer (PDL) material during the manufacture of the PDL.

In addition, prior to step 102, the method further comprises: forming a buffer layer on the base substrate.

In some embodiments, the buffer layer may be deposited on the base substrate by using the Chemical Vapor Deposition (PECVD) process, the evaporation process or the sputtering process.

In addition, after step 104, the method further comprises: attaching a protective film to the inorganic film layer of the non-display region; and removing the protective film after the use of the protective film is completed.

The flexible display substrate, which is obtained by the method of manufacturing the flexible display substrate as provided in the embodiment of the present disclosure, can fill the groove with the filling structure, which causes a surface of the region corresponding to the groove to become flat so as to reduce a contact area between the surface and the protective film, reduce a surface area of the attachment, reduce a bonding strength of the protective film, reduce or even eliminate a risk of delamination which is caused when the protective film is removed.

The method of manufacturing the flexible display substrate is provided in the embodiment of the present disclosure, wherein the flexible display substrate has a display region and a non-display region, the method comprises: providing a base substrate; forming an inorganic film layer on the base substrate; providing a groove in the inorganic film layer of the non-display region; and forming a filling structure in the groove. By providing the groove in the inorganic film layer of the non-display region, one aspect of the present disclosure guarantees the flexible display substrate to have a function of preventing the cracks and reduces an effect of the cracks of the inorganic film layer on the OLED. By filling the groove with the filling structure, another aspect of the present disclosure causes a surface of the region corresponding to the groove to become flat so as to reduce a contact area between the surface and the protective film, reduce a surface area of the attachment, reduce a bonding strength of the protective film, reduce or even eliminate a risk of delamination which is caused when the protective film is removed.

Based on the disclosed concept of the aforementioned embodiments, the embodiment of the present disclosure further provides a display panel comprising the flexible display substrate.

The flexible display substrate in the embodiment of the present disclosure employs the flexible display substrate as provided in the aforementioned embodiments, and has a similar implementation principle and implementation effect, which are not further described here.

Based on the disclosed concept of the aforementioned embodiments, the embodiment of the present disclosure further provides a display apparatus comprising the display panel and having a similar implementation principle and implementation effect, which are not further described here.

The display panel in the embodiment of the present disclosure employs the display panel as provided in the aforementioned embodiment, and has a similar implementation principle and implementation effect, which are not further described here.

In some embodiments, the display apparatus may be a Liquid Crystal Display (briefly referred to as LCD) panel, an electronic paper, an Organic Light-Emitting Diode (briefly referred to as OLED) panel, a mobile phone, a tablet computer, a television, a display, a notebook computer, a digital photo frame, a navigator, and any other product or component having the display function, to which no limit is made by the embodiment of the present disclosure.

It should be noted that, the display apparatus as set forth in the embodiment of the present disclosure may be in a Twisted Nematic (briefly referred to as TN) mode, a Vertical Alignment (briefly referred to as VA) mode, an In-plane Switching (briefly referred to as IPS) mode, or an Advance Super Dimension Switch (briefly referred to as ADS) mode, to which no limit is made by the present disclosure.

Although the embodiments disclosed in the present disclosure are as described above, they are merely used to facilitate the understanding of the present disclosure and are not intended to limit the present disclosure. Any modification and variation in the form and details of the implementation may be made by those skilled in the art without departing from the spirit and scope of the disclosure. The scope defined by the appended claims shall prevail.

What is claimed is:

1. A flexible display substrate having a display region and a non-display region, the flexible display substrate comprising:
    a base substrate;
    at least one inorganic film layer provided on the base substrate, wherein the at least one inorganic film layer of the non-display region is provided with a groove, wherein the groove is configured to prevent generation of cracks in the inorganic film layer; and
    a filling structure for filling the groove,
    wherein:
    the groove comprises a plurality of grooves,
    the filling structure comprises a filler and a bump, wherein the filler is provided within the groove, the bump is provided above the groove, the bump covers the plurality of grooves, the filling structure has a material of an organic material, and the filling structure directly contacts an upper surface of the base substrate, and
    the at least one inorganic film layer comprises a plurality of inorganic film layers, the plurality of grooves are provided in at least one of the plurality of inorganic film layers, wherein depth of the plurality of grooves is less or equal to thickness of the plurality of inorganic film layers, and wherein the plurality of grooves penetrate through at least one of the plurality of inorganic film layers.

2. The flexible display substrate according to claim 1, wherein a space exists between the plurality of grooves.

3. The flexible display substrate according to claim 2, wherein the space between the grooves is 3 to 30 μm.

4. The flexible display substrate according to claim 1, wherein a cross section of the groove is a rectangle or a trapezoid in a direction perpendicular to a surface of the base substrate.

5. The flexible display substrate according to claim 4, wherein the cross section of the groove is the rectangle, and the groove has a width of 3 to 20 μm.

6. The flexible display substrate according to claim 4, wherein the cross section of the groove is the trapezoid, and the groove has a long side of 5 to 20 μm and a short side of 3 to 10 μm.

7. The flexible display substrate according to claim 4, wherein the groove is provided in a region within 300 μm from an edge of the base substrate.

8. The flexible display substrate according to claim 4, wherein the filler and the bump are integrally formed.

9. The flexible display substrate according to claim 8, wherein a distance between an edge of the bump and an edge of the groove closest to the edge of the bump is 20 to 100 μm, and the bump has a height less than or equal to 30 μm.

10. The flexible display substrate according to claim 1, wherein the groove has the depth of 0.5 to 10 μm.

11. A display panel comprising the flexible display substrate according to claim 1.

12. The display panel according to claim 11, wherein a space exists between the plurality of grooves.

13. The display panel according to claim 11, wherein a cross section of the groove is a rectangle or a trapezoid in a direction perpendicular to a surface of the base substrate.

14. The display panel according to claim 13, wherein the filler and the bump are integrally formed.

15. A display apparatus comprising the display panel according to claim 11.

16. A method of manufacturing a flexible display substrate, the flexible display substrate having a display region and a non-display region, the method comprising:
    providing a base substrate;
    forming at least one inorganic film layer on the base substrate;
    providing a groove in the at least one inorganic film layer of the non-display region, wherein the groove is configured to prevent generation of cracks in the inorganic film layer; and
    filling the groove to form a filling structure;
    wherein:
    the groove comprises a plurality of grooves,
    the filling structure comprises a filler and a bump, wherein the filler is provided within the groove, the bump is provided above the groove, the bump covers the plurality of grooves, the filling structure has a material of an organic material, and the filling structure directly contacts an upper surface of the base substrate, and
    the at least one inorganic film layer comprises a plurality of inorganic film layers, the plurality of grooves are provided in at least one of the plurality of inorganic film layers, wherein depth of the plurality of grooves is less or equal to thickness of the plurality of inorganic film layers, and wherein the plurality of grooves penetrate through at least one of the plurality of inorganic film layers.

17. The method according to claim 16, wherein after forming the filling structure, the method further comprises:
    attaching a protective film to the inorganic film layer of the non-display region; and
    removing the protective film after the use of the protective film is completed.

* * * * *